(12) United States Patent
Lee

(10) Patent No.: US 7,186,639 B2
(45) Date of Patent: Mar. 6, 2007

(54) METAL INTERCONNECTION LINES OF SEMICONDUCTOR DEVICES AND METHODS OF FORMING THE SAME

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 217 days.

(21) Appl. No.: 11/009,723

(22) Filed: Dec. 10, 2004

(65) Prior Publication Data

US 2005/0127510 A1 Jun. 16, 2005

(30) Foreign Application Priority Data

Dec. 11, 2003 (KR) .................. 10-2003-0090328

(51) Int. Cl.
*H01L 21/4763* (2006.01)

(52) U.S. Cl. ............... 438/618; 438/926; 257/E23.001; 257/E21.575; 257/E23.151; 257/E21.627; 257/E21.641

(58) Field of Classification Search ................ 438/618, 438/926; 257/E23.001, E21.575, E23.151, 257/E21.627, E21.641
See application file for complete search history.

(56) References Cited

U.S. PATENT DOCUMENTS

| | | | | |
|---|---|---|---|---|
| 5,275,973 | A * | 1/1994 | Gelatos | ....................... 438/623 |
| 6,380,087 | B1 * | 4/2002 | Gupta et al. | ................. 438/692 |
| 6,413,852 | B1 * | 7/2002 | Grill et al. | .................... 438/619 |
| 6,451,666 | B2 * | 9/2002 | Hong et al. | .................. 438/397 |
| 2002/0182845 | A1 * | 12/2002 | Miyano et al. | ............. 438/618 |
| 2003/0143832 | A1 * | 7/2003 | Shroff et al. | ................. 438/618 |
| 2005/0087875 | A1 * | 4/2005 | Furukawa et al. | .......... 257/758 |

FOREIGN PATENT DOCUMENTS

| | | |
|---|---|---|
| KR | 0147195 | 5/1998 |
| WO | WO 2004/053948 A2 * | 6/2004 |

* cited by examiner

*Primary Examiner*—Michelle Estrada
(74) *Attorney, Agent, or Firm*—Andrew D. Fortney

(57) ABSTRACT

Metal interconnection lines of semiconductor devices and methods of forming the same are disclosed. Improved reliability is achieved in a disclosed metal line of a semiconductor device by preventing metal layers from eroding and preventing metal lines from being destroyed due to electromigration (EM) and stress-migration (SM). An illustrated metal interconnection line includes: a semiconductor substrate; a metal pattern on the substrate; a glue pattern under the metal pattern; an anti-reflection pattern on the metal pattern; and dummy patterns surrounding side walls of the metal pattern.

9 Claims, 4 Drawing Sheets

METAL INTERCONNECTION LINES OF SEMICONDUCTOR DEVICES AND METHODS OF FORMING THE SAME

FIELD OF THE DISCLOSURE

The present disclosure relates generally to semiconductor devices and more particularly, to metal interconnection lines of semiconductor devices and methods of forming the same.

BACKGROUND

A method of forming a metal interconnection line of a conventional semiconductor device will now be described with reference to FIGS. 1A to 1C.

Referring to FIG. 1A, a bottom glue layer 11 of Ti/TiN is formed on a semiconductor substrate 10 such as a silicon wafer by a sputtering method. Next, in a no vacuum-break condition, a metal layer 13 of Al—Cu or Al—Cl—Si is formed on the bottom glue layer 11 by a sputtering method. Next, a Ti/TiN layer is deposited on the metal layer 13 by a sputtering method to form a top anti-reflection coating (ARC) layer 15.

Referring to FIG. 1B, a photoresist layer pattern 17 is formed on the top ARC layer 15 by a photolithography process to expose portions of the top ARC layer 15.

Referring to FIG. 1C, the top ARC layer 15, the metal layer 13, and the bottom glue layer 11 are subsequently etched using the photoresist layer pattern 17 as a mask to form the metal interconnection lines 100. Each interconnection line is made of a top ARC pattern 15', a metal pattern 13', and a bottom glue pattern 11'. In FIG. 1C, reference number A indicates etched portions which electrically isolate the metal interconnection lines 100. Next, the photoresist layer pattern 17 is removed by a well-known method.

However, in the conventional method of forming the metal interconnection line described above, the metal layer 13 may be eroded when the metal layer 13 is etched and the photoresist layer pattern 17 is removed. In addition, the metal interconnection line may be destroyed due to electro-migration (EM) and stress-migration (SM).

DETAILED DESCRIPTION

Figure 1A:
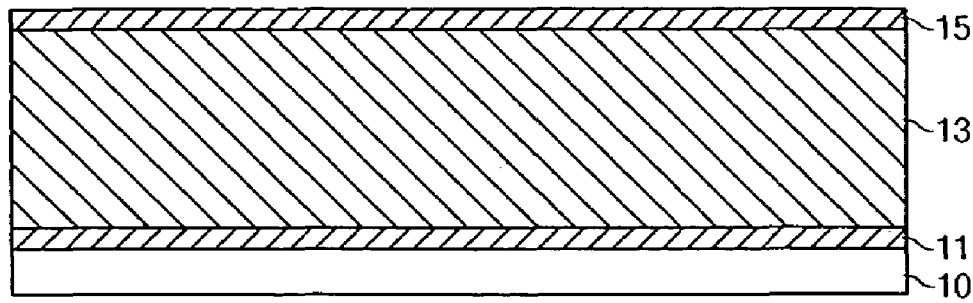
FIGS. 1A to 1C are cross sectional views illustrating a prior art method of forming a metal interconnection line of a conventional semiconductor device.
Figure 1B:
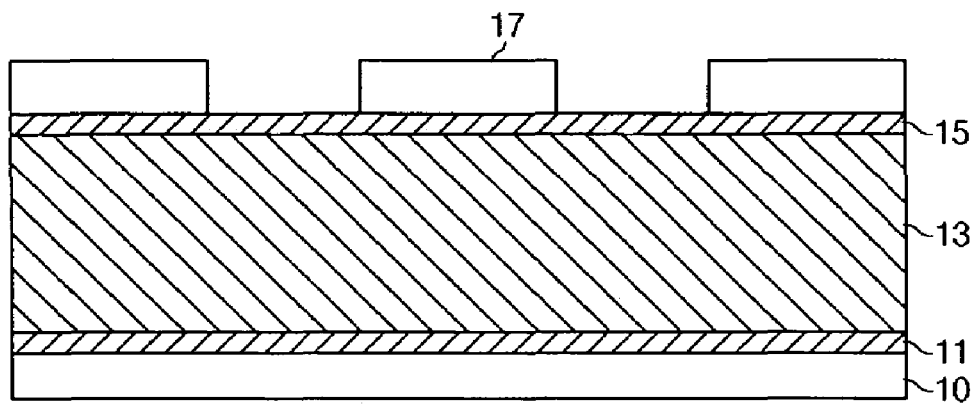
Figure 1C:
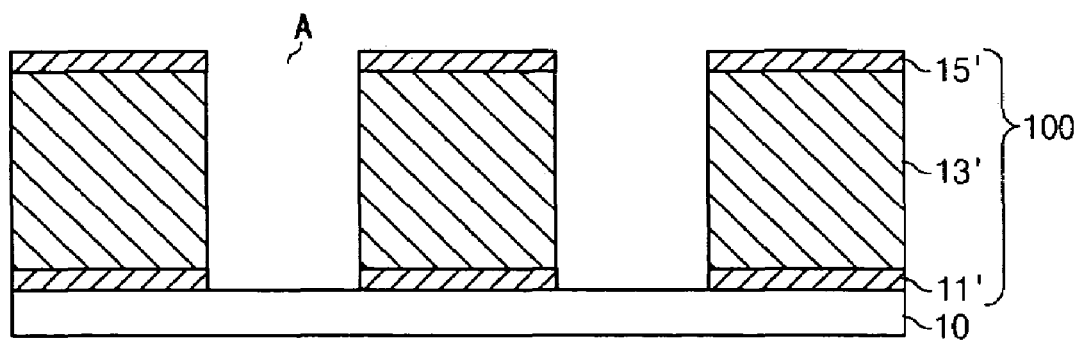
Figure 2A:
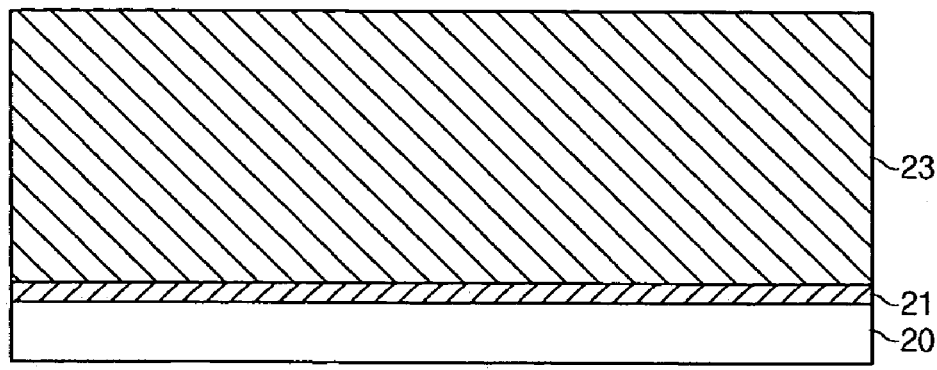
FIGS. 2A to 2G are cross sectional views illustrating an example method of forming a metal interconnection line of a semiconductor device performed in accordance with the teachings of the present invention.

FIGS. 2A to 2G are cross sectional views illustrating an example method of forming a metal interconnection line of a semiconductor device performed in accordance with the teachings of the present invention. Referring to FIG. 2A, a bottom glue layer 21 is formed on a semiconductor substrate 20 such as a silicon wafer by depositing a Ti layer, TiN layer, or Ti/TiN layer using a sputtering method. Next, a dummy layer 23 is formed on the bottom glue layer 21 by a sputtering method. In the illustrated example, the dummy layer 23 is made of any of titanium nitride (TiN), tantalum nitride (TaN), or tungsten nitride (WN). The dummy layer 23 has the same thickness as of the thickness of the subsequently-formed metal pattern.

Figure 2B:
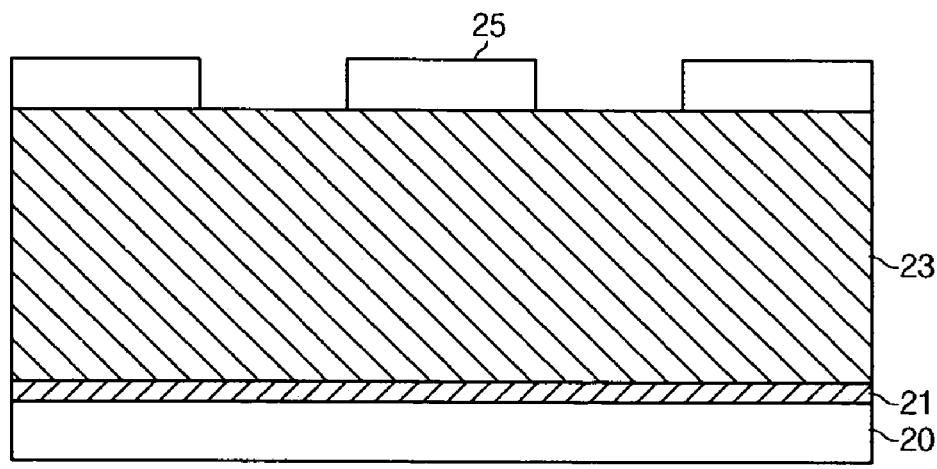

Referring to FIG. 2B, a first photoresist layer pattern 25 is formed on the dummy layer 23 by a photolithography process to expose portions of the dummy layer 23.

Figure 2C:
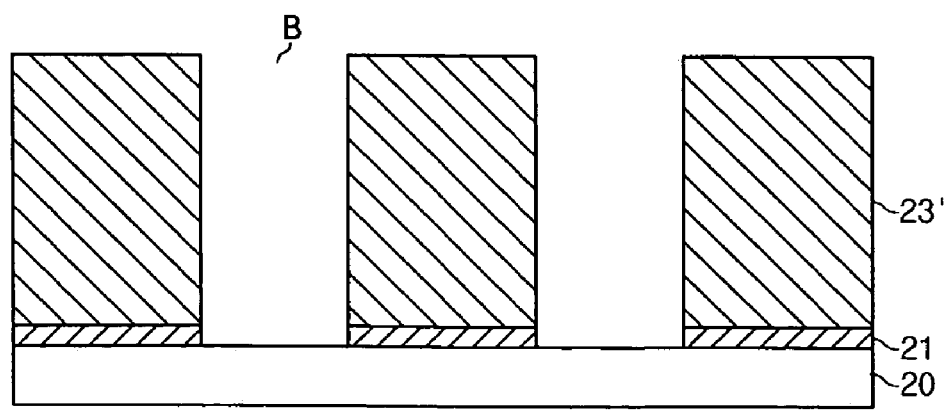

Referring to FIG. 2C, the exposed portions of the dummy layer 23 are etched by a dry etching process using the first photoresist layer pattern 25 (see FIG. 2B) as a mask to form dummy patterns 23'. In FIG. 2C, reference number B indicates etched portions of the dummy layer 23.

Next, the first photoresist layer pattern 25 is removed by a well-known method.

Figure 2D:
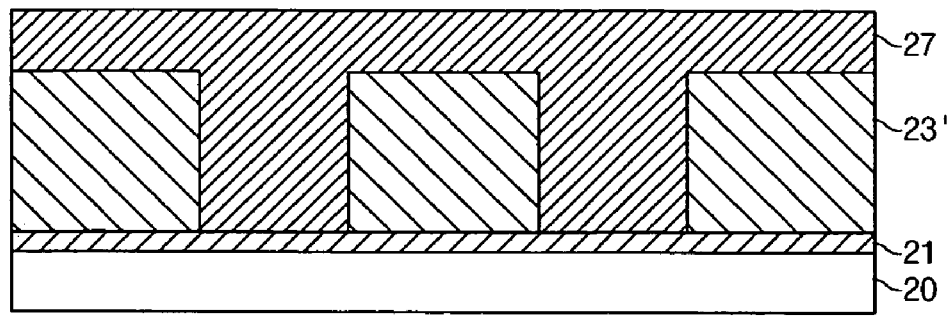

Referring to FIG. 2D, a metal layer 27 is deposited on the entire surface of the substrate 20 by a chemical vapor deposition (CVD) method, sputtering method, or plating method. The metal layer 27 fills the gaps between the dummy patterns 23'. In the illustrated example, the metal layer 27 is made of any of Al, Cu, Al—Cu, or Al—Cl—Si.

Figure 2E:
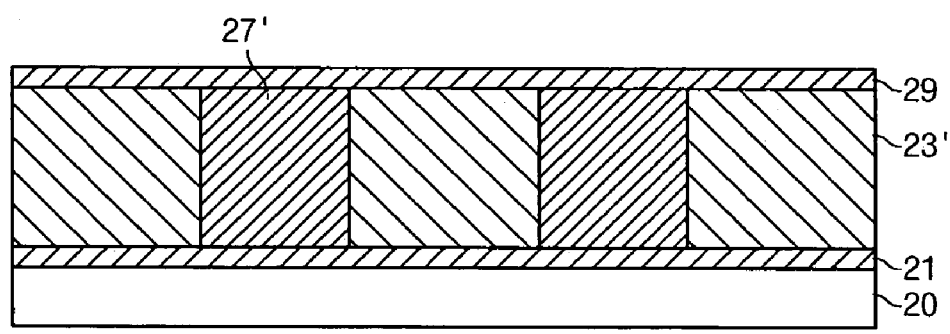

Referring to FIG. 2E, the surface of the substrate 20 is planarized by a planarization process such as a chemical mechanical polishing (CMP) process or an etch-back process to expose the surfaces of the dummy patterns 23'. As a result, metal patterns 27' are formed between the dummy patterns 23'. Next, a Ti/TiN layer is deposited on the entire surface of the substrate 20 to form a top anti-reflection coating (ARC) layer 29 by a sputtering method.

Figure 2F:
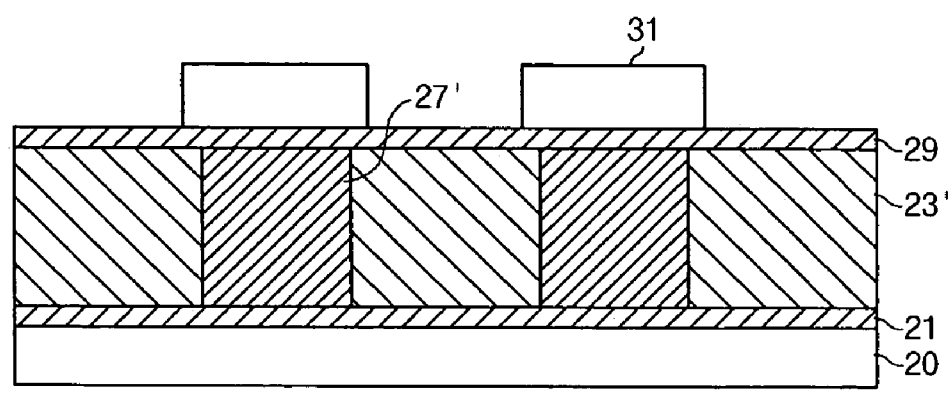

Referring to FIG. 2F, a second photoresist layer pattern 31 is formed on the top ARC layer 29 by a photolithography process. In the example illustrated in FIG. 2F, the second photoresist pattern 31 is disposed above the metal pattern 27', and the widths of the second photoresist layer patterns 31 are wider than the corresponding widths of the metal pattern 27'. Therefore, the second photoresist layer patterns 31 can mask their corresponding metal patterns 27' and portions of the dummy patterns 23' in the vicinity of the metal patterns 27'.

Figure 2G:
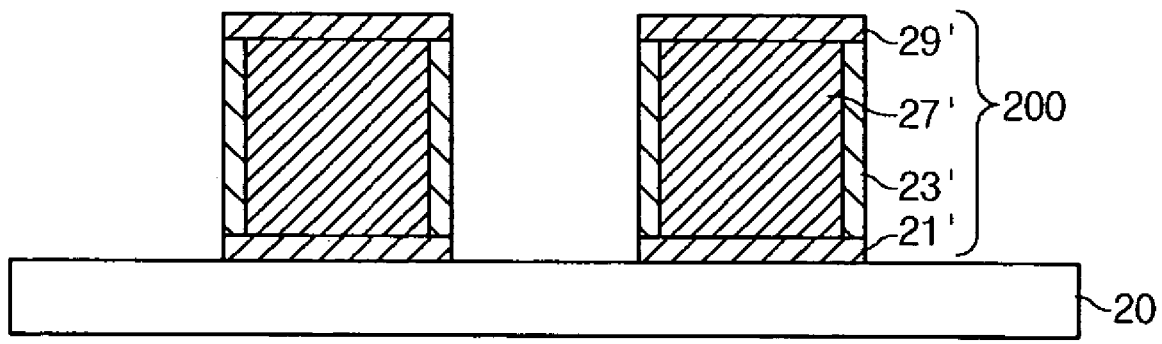

Referring to FIG. 2G, the top ARC layer 29, the dummy patterns 23', and the bottom glue layer 21 are etched by a dry etching process using the second photoresist layer pattern 31 (see FIG. 2F) as a mask to form metal interconnection lines 200. Each of the metal interconnection lines 200 comprises a stacked structure including a top ARC pattern 29'/metal pattern 27'/bottom glue pattern 21' and portions of the dummy patterns 23' which surround the side walls of the metal pattern 27'.

Next, the second photoresist layer pattern 31 is removed by a well-known method.

In the example described above, since the metal patterns 23' are formed by filling gaps between the dummy patterns 23' with the metal layer 27 and planarizing the metal layer 27, it is unnecessary to etch the metal layer 27. Therefore, it is possible to prevent the metal layer 27 from eroding due to etching.

In addition, the dummy patterns 23' surround the side walls of the metal pattern 27', so that the metal pattern 27' is protected by the dummy patterns 23' when the second photoresist layer pattern 31 is removed. Therefore, it is possible to prevent the metal pattern 27' from eroding when removing the photoresist layer pattern 31.

In addition, since each of the metal interconnection lines 200 has a structure in which a metal pattern 27' is completely surrounded by the dummy patterns 23', the bottom glue pattern 21', and the top ARC pattern 29', it is possible to prevent the metal interconnection lines from being destroyed due to electro-migration (EM) and stress-migration (SM) of the metal pattern 27'.

As a result of the foregoing, it is possible to improve the reliability of the metal interconnection line(s) of a semiconductor device.

From the foregoing, persons of ordinary skill in the art will appreciate that a metal interconnection line of a semiconductor device has been disclosed which is has improved reliability. The increase in reliability is achieved in the illustrated example by preventing a metal layer from eroding and preventing the metal interconnection line from being destroyed due to electro-migration (EM) and stress-migration (SM).

In addition, another object of the present invention is to provide a method of forming the metal interconnection line of the semiconductor device.

A disclosed example metal interconnection line of a semiconductor device includes: a semiconductor substrate; a metal pattern on the substrate; a glue pattern under the metal pattern; an anti-reflection pattern on the metal pattern; and dummy patterns surrounding side walls of the metal pattern.

A disclosed example method of forming a metal interconnection line of a semiconductor device comprises: forming a glue layer on a semiconductor substrate; forming dummy patterns on the glue layer; forming metal patterns to fill gaps between the dummy patterns; forming an anti-reflection layer on the entire surface of the substrate; forming a photoresist layer pattern on the anti-reflection layer to mask the metal pattern and portions of the dummy pattern adjacent the metal pattern; forming metal interconnection lines by etching the anti-reflection layer, the dummy patterns, and the glue layer using the photoresist layer pattern as a mask; and removing the photoresist layer pattern.

It is noted that this patent claims priority from Korean Patent Application Serial Number 10-2003-0090328, which was filed on Dec. 11, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a metal interconnection line of a semiconductor device, comprising:

forming a glue layer on a semiconductor substrate;

forming dummy patterns on the glue layer;

forming a metal pattern to fill a gap between the dummy patterns;

forming an anti-reflection layer;

forming a photoresist layer pattern on the anti-reflection layer to mask the metal pattern and portions of the dummy patterns adjacent the metal pattern;

forming a metal interconnection line by etching the anti-reflection layer, the dummy patterns, and the glue layer using the photoresist layer pattern as a mask; and removing the photoresist layer pattern.

2. A method as defined in claim 1, wherein forming the dummy patterns comprises:

forming a dummy layer on the glue layer; and patterning the glue layer to expose the glue layer.

3. A method as defined in claim 2, wherein the dummy patterns comprise titanium nitride (TiN), tantalum nitride (TaN), or tungsten nitride (WN).

4. A method as defined in claim 2, wherein a thickness of the metal pattern and a thickness of the dummy patterns are substantially identical.

5. A method as defined in claim 1, wherein forming the metal pattern comprises:

forming a metal layer on an entire surface of the substrate and dummy patterns to fill gaps between the dummy patterns; and performing a planarization process to expose surfaces of the dummy patterns.

6. A method as defined in claim 5, wherein the metal pattern comprises Al, Cu, Al—Cu, or Al—Cu—Si.

7. A method as defined in claim 1, wherein in the etching performed in forming the metal interconnection line is dry etching.

8. A method as defined in claim 1, wherein the glue pattern is a Ti layer, TiN layer, or Ti/TiN layer.

9. A method as defined in claim 1, wherein the anti-reflection pattern is a Ti/TiN layer.

* * * * *